US008635906B2

(12) United States Patent  
Strahan et al.

(10) Patent No.: US 8,635,906 B2  
(45) Date of Patent: Jan. 28, 2014

(54) TRACKING FILTER APPARATUS FOR WHEEL MONITORING SYSTEMS

(75) Inventors: Samuel Strahan, Ballymena (GB); Christopher Ainsworth, Swindon (GB)

(73) Assignee: Schrader Electronics Limited, Antrim (GB)

( * ) Notice: Subject to any disclaimer, the term of this patent is extended or adjusted under 35 U.S.C. 154(b) by 0 days.

(21) Appl. No.: 13/422,872

(22) Filed: Mar. 16, 2012

(65) Prior Publication Data

US 2012/0234087 A1 Sep. 20, 2012

Related U.S. Application Data

(63) Continuation of application No. PCT/EP2010/005712, filed on Sep. 17, 2010.

(30) Foreign Application Priority Data

Sep. 18, 2009 (GB) .................................. 0916369.2

(51) Int. Cl.  
*B60C 23/02* (2006.01)

(52) U.S. Cl.  
USPC ........... 73/146.3; 73/146; 73/146.2; 702/189; 702/190

(58) Field of Classification Search  
USPC ...................................... 702/190; 73/146, 598  
See application file for complete search history.

(56) References Cited

U.S. PATENT DOCUMENTS

| 3,375,451 | A | * | 3/1968 | Borelli et al. ................. 327/556 |
| 3,638,037 | A | | 1/1972 | McMurtrie |
| 5,761,383 | A | * | 6/1998 | Engel et al. ..................... 706/14 |
| 6,739,195 | B2 | * | 5/2004 | Evans et al. ..................... 73/598 |
| 7,367,227 | B2 | | 5/2008 | Stewart et al. |
| 2005/0148309 | A1 | | 7/2005 | Fukusen et al. |
| 2007/0255510 | A1 | | 11/2007 | Mancosu et al. |

OTHER PUBLICATIONS

International Search Report for International Application No. PCT/EP2010/005712, dated Dec. 23, 2010, 3 pages.  
Written Opinion of the International Searching Authority for International Application No. PCT/EP2010/005712, dated Dec. 23, 2010, 5 pages.

* cited by examiner

*Primary Examiner* — Lisa Caputo  
*Assistant Examiner* — Roger Hernandez-Prewitt  
(74) *Attorney, Agent, or Firm* — Brinks Gilson & Lione

(57) ABSTRACT

A wheel monitoring system that includes a tracking filter apparatus for tracking a signal that has a varying main frequency. The tracking filter apparatus has an adjustable filter and a filter controller arranged to measure the amplitude of the filtered signal and to compare amplitude against a reference value. The filter controller adjusts the cut off frequency of the filter if the measured amplitude differs from the reference value by an amount that exceeds a threshold value. The filter controller adjusts the cut off frequency such that the main frequency lies within the roll off region of the filter's frequency response. The system may be used to track signals that are produced by shock sensors in a wheel mounted monitoring device.

21 Claims, 7 Drawing Sheets

TRACKING FILTER APPARATUS FOR WHEEL MONITORING SYSTEMS

CROSS-REFERENCE TO RELATED APPLICATIONS

This application is a continuation of International Application No. PCT/EP2010/005712, filed on Sep. 17, 2010, which claims priority to Great Britain Application No. 0916369.2, filed on Sep. 18, 2009, both of which are hereby incorporated by reference in their entireties.

FIELD OF THE DISCLOSURE

The present disclosure relates to filters for tracking electrical signals, especially signals emanating from rotating wheels such as the wheels of moving vehicles. The disclosure relates particularly to filters for wheel-mounted monitoring devices.

BACKGROUND

Electrical signals emanating from apparatus on board a vehicle's wheel usually include a significant amount of signal noise, especially when the vehicle is travelling over rough ground. In some cases, the signal component that it is desired to detect is dependent on wheel speed and this complicates the extraction of the desired signal component from the noise.

By way of example, U.S. Pat. No. 7,367,227 discloses a Tire Pressure Monitoring System (TPMS) in which a pair of shock sensors are included in a wheel-mounted tire pressure measuring device, the shock sensors producing electrical signals from which the respective wheel's location on a vehicle can be deduced. The electrical signals produced by the shock sensors include a main signal component, representing the output of the shock sensor, and signal noise. The frequency and amplitude of the signal noise are sufficiently close to the frequency and amplitude of the main signal component that it can be difficult to reliably detect the main signal component. Further, the frequency of the main signal component is determined by the rotational speed of the wheel. This increases the difficulty in detecting the main signal component since its frequency is initially unknown and is variable. As a result, conventional static filters cannot reliably extract the main signal component, especially when the vehicle is travelling over rough ground. A similar problem arises when other sensors, for example microelectromechanical systems (MEMS) sensors or accelerometers are used.

It would be desirable, therefore, to provide a filtering apparatus that is capable of reliably detecting electrical signals that emanate from apparatus on board rotating wheels.

BRIEF DESCRIPTION OF THE DRAWINGS

An embodiment of the disclosure is now described by way of example and with reference to the accompanying drawings in which.

DETAILED DESCRIPTION OF THE DRAWINGS

Figures 1, 2:
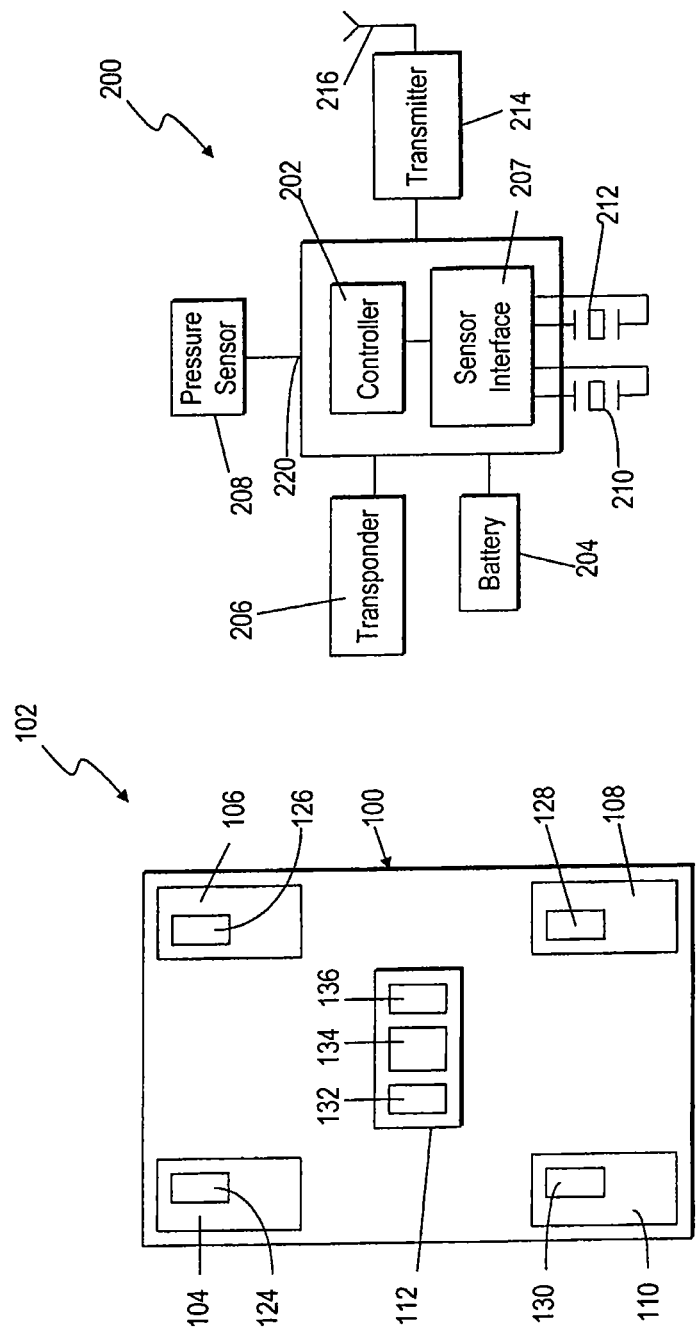
FIG. 1 is a block diagram of an embodiment of a tire monitoring system (TMS) shown in conjunction with parts of a vehicle.
FIG. 2 is a block diagram of a tire monitoring apparatus included in the TMS of FIG. 1.

A first aspect of the disclosure provides a wheel monitoring system comprising a wheel monitoring device that is mountable on said wheel and configured to generate a first signal that is indicative of a characteristic of said wheel, the wheel having, in use, a variable rotational speed, said first signal having a main frequency that is dependant on said variable rotational speed, wherein said wheel monitoring system further includes a tracking filter apparatus, the tracking filter apparatus comprising: an input configured to receive said first signal; an adjustable filter arranged to receive said first signal and to produce a filtered first signal, said adjustable filter having an adjustable cut off frequency; and a filter controller arranged to measure at least one characteristic of said filtered first signal and to compare said at least one measured characteristic against a reference value, the filter controller being co-operable with said adjustable filter to adjust said cut off frequency if said at least one measured characteristic differs from said reference value by an amount that exceeds a threshold value.

The threshold value may be zero, or may be set at a level that allows tolerance in the comparison.

The filtered first signal typically has a main signal component at said main frequency, said main signal component having an amplitude, said at least one characteristic of said filtered first signal conveniently comprising said amplitude.

In preferred embodiments, the adjustable filter has a frequency response that includes a roll off region in which said filter applies an attenuation that varies with frequency, said filter controller being arranged to adjust the cut off frequency of said filter such that said main frequency lies within said roll off region.

In some embodiments, the tracking filter apparatus may apply frequency independent gain to said filtered first signal, it which case said frequency controller may be arranged to adjust the cut off frequency of said filter such that said main frequency lies at a location in said roll off region where said attenuation applied by said filter at least partially negates the effect of said frequency independent gain on said filtered first signal. Said attenuation applied by said filter at said location in said roll off region may be higher than the attenuation applied by said filter at said cut off frequency.

Optionally, said attenuation applied by said filter at said location in said roll off region negates substantially the entire effect of said frequency independent gain on said filtered first signal.

In preferred embodiments, said first signal and said filtered first signal each have a main signal component at said main frequency, said respective main signal components having a respective amplitude, the tracking filter apparatus further including an amplifier between said input and said adjustable filter, the amplifier being arranged to adjust the amplitude of said first signal to a level that causes the amplitude of said filtered first signal to substantially match said reference value when said main frequency lies at a selected location on said roll off region.

Said adjustable filter may comprise a low pass filter, in which case said filter controller is co-operable with said adjustable filter to increase said cut off frequency if said at least one measured characteristic is less than said reference value by an amount that exceeds a first threshold value, and to decrease said cut off frequency if said at least one measured characteristic is more than said reference value by an amount that exceeds a second threshold value.

Alternatively, said adjustable filter may comprise a high pass filter, in which case said filter controller is co-operable with said adjustable filter to increase said cut off frequency if said at least one measured characteristic is more than said reference value by an amount that exceeds a first threshold value, and to decrease said cut off frequency if said at least one measured characteristic is less than said reference value by an amount that exceeds a second threshold value.

In some embodiments, for example when said wheel monitoring device comprises a tire pressure monitor, said wheel monitoring device includes a first motion sensor sensor, said first signal being generated by said first motion sensor. In typical embodiments, said first motion sensor comprises a shock sensor, an accelerometer or a microelectromechanical systems (MEMs) sensor.

More generally, tracking filter apparatus embodying the disclosure may be used with an input signal produced from any device, especially a sensor, wherein a main frequency component of the input signal needs to be extracted from noise.

The tracking filter apparatus is particularly useful in cases where two sensors (or other devices) are provided, each producing a respective output signal with the same fundamental frequency component, and wherein it is desired to determine the phase relationship between the two output signals.

For example, in some embodiments, said wheel monitoring device includes a second sensor (e.g. a second shock sensor, or a second accelerometer, or a second MEMs sensor), said second sensor generating a second signal that is indicative of said characteristic of said wheel, said second signal having a main frequency that is dependant on said variable rotational speed, wherein said wheel monitoring system further includes a second tracking filter apparatus, the second tracking filter apparatus comprising: an input configured to receive said second signal; and an adjustable filter arranged to receive said second signal and to produce a filtered second signal, said adjustable filter having an adjustable cut off frequency, and wherein said filter controller is arranged to measure at least one characteristic of said filtered second signal and to compare said at least one measured characteristic against said reference value, the filter controller being co-operable with said adjustable filter of the second tracking filter apparatus to adjust said cut off frequency if said at least one measured characteristic differs from said reference value by an amount that exceeds a threshold value.

The system may further include a phase detector, each of said first and second filtered signals being provided to the phase detector, the phase detector being arranged to determine a phase relationship between said first and second filtered signals. In such cases, said wheel is typically mounted on a vehicle and said system is arranged to make a determination concerning the location of said wheel on said vehicle depending on said phase relationship.

The, or each, tracking filter apparatus may be included in said wheel monitoring device, or may be provided separately therefrom.

A second aspect of the disclosure provides a wheel monitoring device mountable on a wheel and configured to generate a first signal that is indicative of a characteristic of said wheel, the wheel having, in use, a variable rotational speed, said first signal having a main frequency that is dependant on said variable rotational speed, wherein said wheel monitoring device further includes a tracking filter apparatus, the tracking filter apparatus comprising: an input configured to receive said first signal; an adjustable filter arranged to receive said first signal and to produce a filtered first signal, said adjustable filter having an adjustable cut off frequency; and a filter controller arranged to measure at least one characteristic of said filtered first signal and to compare said at least one measured characteristic against a reference value, the filter controller being co-operable with said adjustable filter to adjust said cut off frequency if said at least one measured characteristic differs from said reference value by an amount that exceeds a threshold value.

A third aspect of the disclosure provides a method of tracking a main frequency component of a first signal in a wheel monitoring system, said wheel having, in use, a variable rotational speed, said main frequency being dependant on said variable rotational speed, wherein said wheel monitoring system further includes an adjustable filter having an adjustable cut off frequency, the method comprising: filtering said first signal, using said adjustable filter, to produce a filtered first signal; measuring at least one characteristic of said filtered first signal; comparing said at least one measured characteristic against a reference value; and adjusting said cut off frequency if said at least one measured characteristic differs from said reference value by an amount that exceeds a threshold value.

It is envisaged that the disclosure may be used to track signals other than those emanating from rotating wheels.

Accordingly, a fourth aspect of the disclosure provides a tracking filter apparatus comprising: an input configured to receive a first signal, said first signal having a varying main frequency; an adjustable filter arranged to receive said first signal and to produce a filtered first signal, said adjustable filter having an adjustable cut off frequency; and a filter controller arranged to measure at least one characteristic of said filtered first signal and to compare said at least one measured characteristic against a reference value, the filter controller being co-operable with said adjustable filter to adjust said cut off frequency if said at least one measured characteristic differs from said reference value by an amount that exceeds a threshold value.

A fifth aspect of the disclosure provides a method of tracking a main frequency component of a first signal in system that includes an adjustable filter having an adjustable cut off frequency, the method comprising: filtering said first signal, using said adjustable filter, to produce a filtered first signal; measuring at least one characteristic of said filtered first signal; comparing said at least one measured characteristic against a reference value; and adjusting said cut off frequency if said at least one measured characteristic differs from said reference value by an amount that exceeds a threshold value.

Further advantageous aspects of the disclosure will become apparent to those ordinarily skilled in the art upon review of the following description of a specific embodiment and with reference to the accompanying drawings.

The term "fundamental" as used herein in relation to frequency components of the input signal is not intended to imply that the frequency must be the lowest tone in a harmonic series. Rather, it is intended to embrace the frequency of any target signal component that it is desired to track. Typically, but not necessarily, the target signal component is the predominant frequency component in the input signal, and it may or may not be the lowest tone of a harmonic series. Referring now to FIG. 1 of the drawings, there is shown, generally indicated as 102, a tire monitoring system (TMS) shown in situ on a vehicle 100. For reasons of clarity, only those portions of the vehicle 100 and TMS 102 that are helpful in understanding the present disclosure are shown.

The vehicle 100 includes wheels 104, 106, 108, 110, each wheel including a tire mounted on a rim. The TMS 102 includes a control unit 112 (such as a vehicle engine control unit (ECU), or a Body Control Module (BCM)) and tire monitors 124, 126, 128, 130, typically referred to as sensors, transmitters, wheel units or the like. The tire monitors 124, 126, 128, 130 measure one or more tire characteristics (e.g. pressure and/or temperature) and transmit corresponding tire data for reception and processing by the control unit 112. Typically, a respective tire monitor is associated with each wheel of the vehicle 100.

In typical embodiments, the tire monitors are capable of measuring tire pressure and of transmitting data to the control unit 112, including data representing the measured tire pressure and usually also identification information uniquely identifying the respective tire monitor. Each of the tire monitors 124, 126, 128, 130 includes a suitably powered wireless transmitter, conveniently a battery powered radio frequency (RF) transmitter, and a pressure sensor for measuring the pressure of the gas (usually air) within the tire. In such embodiments, the system 102 may be referred to as a tire pressure monitoring system (TPMS).

Any suitable control unit may be used in the system 102. By way of example, in the illustrated embodiment, the control unit 112 includes a controller 132, a memory device 134 and a receiver 136 configured to receive wireless transmissions from the tire monitors.

Referring now to FIG. 2, there is shown a block diagram of an embodiment of a tire monitor 200. The tire monitor 200 includes a controller 202, a power source such as a battery 204, a transponder coil 206, a pressure sensor 208, one or more piezoelectric motion sensors 210, 212, a wireless transmitter 214 and an antenna 216. In this illustration, the motion sensors 210, 212 each comprise a respective shock sensor of the type that produces an electrical signal in response to being subjected to acceleration (typically shock sensors are responsive to changes in acceleration), the electrical signal being indicative of, typically proportional to, the experienced acceleration, typically the experienced change in acceleration, especially the rate of change of acceleration. Alternatively, the sensors 210, 212 may each comprise an accelerometer, accelerometric device or a microelectromechanical systems (MEMs) sensor. The main difference between an accelerometer and a shock sensor is that the output signal from a shock sensor is related to a change of force applied to the shock sensor, whereas the output signal from an accelerometer is proportional to the absolute force applied.

During use, the controller 202 is able to determine at least one aspect of the tire monitor's location, for example whether it is on the left side or the right side of the vehicle, based on electrical signals produced by the shock sensors 210, 212 as the wheel rotates.

The shock sensors 210, 212 may serve as a motion switch or rotational sensor for the tire monitor 200. The shock sensors 210, 212 may in combination form a dual axis accelerometer and determine first acceleration along a first axis and second acceleration along a second axis. The shock sensors 210, 212 are one example of a force sensor, displacement sensor, or rotation sensor. The shock sensors may also be referred to generically as piezoelectric rotation sensors. Other types of piezoelectric rotation sensors, or other types of force sensor, displacement sensor, rotation sensor or motion sensor may be used in place of the shock sensors described herein.

Hence, in the illustrated embodiment, the shock sensors 210, 212 may be used both as a motion switch, to determine when the tire is moving, and to determine what side of the vehicle the tire is located on. The shock sensors 210, 212 are coupled with the controller 202.

Any suitable methods may be used to provide the right/left and/or clockwise/counter-clockwise information from shock sensors 210, 212. However, preferably, systems and methods to provide the right/left and/or clockwise/counter-clockwise information such as disclosed in commonly owned Stewart, et al., U.S. Pat. No. 7,367,227, entitled Determination of Wheel Sensor Position Using Shock Sensors and a Wireless Solution are used. Therein, first shock sensor 210 produces a first motion signal, second shock sensor 212 produces a second motion signal and controller 202 is coupled to the first shock sensor and the second shock sensor. A controller circuit is configured to determine right side-left side position information for the tyre monitor based on a lag-lead relationship of the first motion signal and the second motion signal. For example, as a wheel rotates, two waveforms are produced by the shock sensors, which are out of phase by 90 degrees. Depending on the direction of rotation of the wheel, clockwise or counterclockwise, one axis will lead or lag the other axis. Shock sensors convert the acceleration they detect into signals such as voltage waveforms. These signals, including a first signal for acceleration on one axis and a second signal for acceleration on a second axis, can then be amplified, filtered and converted to digital data by the controller of the tyre monitor. Position information about position of a tyre including the tyre monitor can then be determined based on the signal. A decision can subsequently be made as to whether the tyre monitor is rotating in a clockwise or counterclockwise direction, based on the sampled signals from the shock sensors. The position information, such as right hand side positioning or left hand side positioning can be determined from the direction of rotation. In particular, the controller of the tyre monitor can determine a lag/lead relationship of the first acceleration signal for the x axis and the second acceleration signal of the z axis. The controller determines whether the x axis leads or lags the z axis signal. This lag/lead information will indicate wither clockwise or counterclockwise rotation information, and information that the vehicle is travelling forward rather than backing up, the controller can determine whether the tyre monitor is on the right-hand side or the left-hand side of the vehicle. For directional rotation, the disclosed method and apparatus may analyze the alternating +1 g/−1 g component.

The controller 202 may be implemented by any suitable means, for example a microprocessor, microcontroller or other suitable data processing device programmed to perform the functions described herein.

In the illustrated embodiment, the pressure sensor 208 detects the pneumatic air pressure of the tire with which the tire monitor 200 is associated. In alternative embodiments, the pressure sensor 208 may be supplemented with or replaced by a temperature sensor or other devices for detecting tire data. An indication of the tire data is provided by the controller 202 at an input 220.

A shock sensor interface 207 is provided in the tire monitor 200 and is configured to provide the necessary control signals and detect the electrical signals from the shock sensors 210, 212. The shock sensors 210, 212 in one embodiment are responsive to changes in acceleration to produce an output in the form of an electrical charge output signal. The output signal is typically in the order of 1 mV/g. The shock sensor interface 207 receives the electrical output signal, which is analog in nature, amplifies and filters the signal to provide a corresponding processed output signal to the controller 202. The shock sensor interface 207 operates in response to control signals from the controller 202. Preferably, both shock sensors 210, 212 can share the same interface 207 via multiplexing.

The output signal produced by each shock sensor comprises a main signal component and other signal components in the form of signal noise. The frequency and amplitude of the noise components are sufficiently close to the frequency and amplitude of the main signal component that it can be difficult to reliably detect the main signal component. Further, the frequency of the main signal component is determined by, i.e. varies with, the rotational speed of the wheel.

Figure 3:
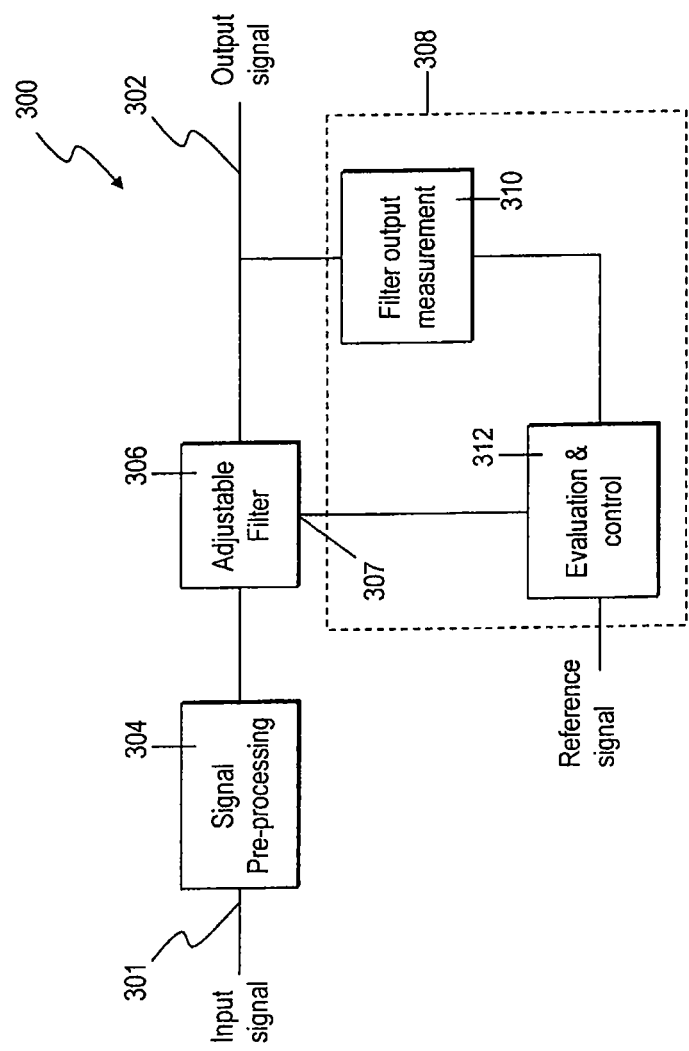
FIG. 3 is a block diagram of a first tracking filter apparatus embodying one aspect of the present disclosure.

FIG. 3 is a block diagram of a tracking filter apparatus 300 embodying one aspect of the present disclosure. The apparatus 300 has an input 301 configured to receive an input signal, and an output 302 for supplying an output signal. The input signal is typically electrical, and may be analog or digital depending on the application. The output signal is a processed version of the input signal. The primary processing operation to be performed by the apparatus 300 on the input signal is filtering, for example, high pass, low pass or band pass filtering, although one or more other processing operations may be performed as required.

The apparatus 300 is particularly suited to filtering input signals having a variable frequency. Typically, the input signal is comprised of more than one signal component, each component having its own respective frequency, in which case it is assumed that at least one signal component—which may be referred to as the main or fundamental signal component(s)—has a variable frequency. In such cases, the primary function of the apparatus 300 may be to extract the main signal component from the input signal by allowing it to pass while attenuating the other signal components (which may be regarded as noise). Accordingly, the apparatus 300 is particularly, but not exclusively, suited for filtering the electrical signals that emanate from wheel-mounted devices. The apparatus 300 may be incorporated into a wheel-mounted device, or may be separate from the wheel-mounted device but associated therewith to receive electrical signals therefrom. By way of example, the apparatus 300 may be incorporated into, or associated with, a tire monitoring device. In such cases, the apparatus 300 may receive as its input signal the electrical signal produced by a shock sensor such as those described above with reference to FIGS. 1 and 2. As such, the apparatus 300 is suitable for incorporation into the shock sensor interface 207, or similar component of a comparable system.

The main signal component is the target signal component that the apparatus 300 is desired to extract. Typically, but not necessarily, the main signal component is the predominant signal component and may also be referred to as the fundamental frequency component.

In typical embodiments, the tracking filter apparatus 300 includes a signal pre-processing module 304 for performing one or more signal processing operations, for example amplification and/or filtering, on the input signal. The pre-processing operations can take any conventional form and depend on the application and/or on the nature of the input signal. In typical embodiments, the pre-processing module 304 comprises an amplifier (not shown in FIG. 3) arranged to set the amplitude (in particular the peak amplitude) of the input signal to a reference level. To this end, it is preferred if the amplifier is a variable gain amplifier. More particularly, the amplitude of the input signal is set substantially to a level that corresponds with a chosen point on the roll off slope of the filter's 306 response (e.g. the cut off frequency) when compared to a reference value. This is described in further detail hereinafter.

An adjustable filter 306 is provided for filtering the input signal (after signal pre-processing in this example) to produce the filtered output signal. The filter 306 is typically a high pass or low pass filter, but could alternatively take other forms, for example band pass or band stop. The filter 306 has at least one cut off frequency (also known as corner frequency or break frequency) that is adjustable by means of a control signal received at an input 307. The, or each, cut off frequency defines a boundary between a pass band and a stop band of the filter 306. Typically, a cut off frequency is the frequency at which the filter attenuates signals by 3 dB or more, although the level of attenuation may be defined at a higher or lower level. In typical embodiments, the filter 306 is a low pass filter or a high pass filter in which case there is a single cut off frequency.

The filter 306 may comprise an analog filter or a digital filter, as suited to the application, and may take any suitable conventional form. The form of the control signal received at input 307 depends on the type of the filter 306. For example, for some analog filters, such as switching capacitor filters or some transconductor-capacitor filters, the control signal takes the form of a clock signal whose frequency determines the cut off frequency of the filter. For other filters, the control signal may take different forms, for example in a digital filter the control signal may comprise information for adjusting the filter coefficients.

The apparatus 300 further includes a filter control module 308 that measures at least one characteristic of the filtered output signal from filter 306 and compares the measured characteristic(s) against a reference value. Depending on the outcome of the comparison, the control module 308 may adjust the cut off frequency of the filter 306. In preferred embodiments, the cut off frequency is adjusted so that the main frequency of the input signal, that is the frequency of the target signal component of the input signal (hereinafter referred to as the fundamental frequency of the input signal), is within a frequency range that corresponds with the roll off region of the filter's 306 response. Typically, this is achieved by adjusting the cut off frequency so that the fundamental frequency of the input signal is substantially at a chosen location in the roll off region, for example substantially at a frequency where the filter's 306 attenuation is at an acceptable level. Conveniently, the cut off frequency of the filter 306 may serve as the chosen location in the roll off region, although a frequency above or below the cut off frequency may be chosen, especially if the filter 306 introduces frequency independent gain to the signal.

In preferred embodiments, the measured characteristic of the filter's 306 output signal is, or includes, the amplitude of the output signal, and in particular the peak amplitude of the output signal. This is illustrated with reference to FIG. 4 in is which it is assumed, by way of example, that the filter 306 is a low pass filter. Using a low pass filter as filter 306 is appropriate in cases where the unwanted signal components of the input signal, including noise, are of higher frequency than the fundamental frequency.

Figure 4:
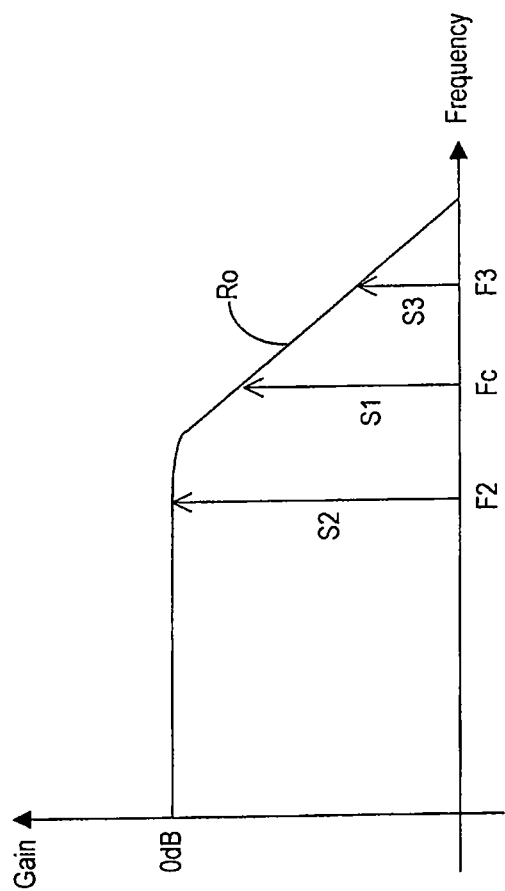
FIG. 4 is a graph representing the frequency response of a low pass filter.

FIG. 4 is a graph of a typical frequency response of a low pass filter, the frequency response having a cut off frequency Fc below which signals are considered to be passed, and above which signals are considered to be stopped. The response has a roll off region (slope) Ro, along which signals are increasingly attenuated as their frequency increases. The cut off frequency Fc is located on the roll off slope Ro. It is desired to adjust the filter response to maintain the frequency of the main component of the input signal substantially at a chosen location on the roll off slope Ro of the response. In this example, the chosen location is substantially at the cut off frequency Fc. Signal S1 represents an input signal with a fundamental frequency that is substantially at the cut off frequency Fc. This is a desirable state of operation since signals at the fundamental frequency will be passed by the filter, while higher frequency signals, such as noise, will effectively be blocked by the filter. Signal S2 represents an input signal with a fundamental frequency F2 that is below the cut off frequency Fc. Signal S2 is passed by the filter, but so too are any unwanted signal components having a frequency between F2 and Fc. It would be desirable therefore to lower Fc, preferably until it substantially matches F2. Signal S3 represents an input signal with a fundamental frequency F3 that is above the cut off frequency Fc. Signal S3 is blocked by the filter and so it is necessary to increase Fc, preferably until it substantially matches F3.

The filter controller 308 is able to determine whether or not the cut off frequency Fc requires adjustment by measuring the amplitude of the signals S1, S2, S3. This is because the level of attenuation applied to signals by the filter 306 at Fc is known and so, when Fc matches the fundamental frequency of the input signal, an expected amplitude value for the filtered output signal can be calculated from the amplitude of the input signal (also taking into account any other gain that is introduced by the filter 306 and pre-processing module 304). Hence, if the measured amplitude of the output signal is less than the expected value, the filter controller 308 can deduce that Fc is too low and should be increased. If the measured amplitude of the output signal is more than the expected value, the filter controller 308 can deduce that Fc is too high and should be decreased. If the measured value substantially matches the expected value, then Fc may be maintained at its current setting. Thus, the filter apparatus 300 is able to track an input signal having a varying fundamental frequency. It is assumed that the amplitude of the main, or fundamental, component of the input signal is substantially constant. The filtered output signal produced by the apparatus 300 is therefore typically also of substantially constant amplitude (within tolerance limits, as is described in further detail below).

In a typical mode of operation, the cut off frequency is set initially to a relatively low value and is increased by the apparatus 300 until it is compatible with the fundamental frequency of the input signal. Thereafter, the operation of the apparatus 300 causes the cut off frequency to be altered to track changes in the fundamental frequency of the input signal.

It will be apparent that a corresponding but opposite mode of operation applies to high pass filters—Fc is increased if the measured amplitude exceeds the expected value and decreased if the measured amplitude is less than the expected value.

The expected value for the filtered output signal is conveniently represented by a reference value (as illustrated in FIG. 3) provided to, or available to, the filter control module 308 in any suitable manner. In cases where the apparatus 300 is comprised of analogue circuitry, the reference value may be provided in the form of an electrical signal, e.g. voltage level, which may be provided from an external or internal source. In digital embodiments, the reference value may be held in a data memory (not shown).

In the embodiment of FIG. 3, the filter controller 308 comprises a filter output measurement module 310 that is configured to measure the relevant characteristic(s)—amplitude in the present example, preferably peak amplitude—of the filtered output signal and provide an indication of same to an evaluation and control module 312. The evaluation and control module 312 compares the data received from the filter output measurement module 310 with the reference value and decides whether the cut off frequency Fc needs to be increased, decreased or maintained at its current level. The evaluation and control model 312 then generates a filter control signal, as appropriate, which is communicated to the filter 306 via input 307.

In analog embodiments, the evaluation and control module 312 and the filter output measurement module 310 may comprise any suitable analog circuitry, communicating with each other and with the filter 306 by means of electrical signals. In digital embodiments, the evaluation and control module 312, the filter output measurement module 310 and the filter 306 may be implemented in software, hardware or any suitable combination thereof, in which case some or all of the communication and signalling, including the filter control signal, may be performed in software.

Figure 5:
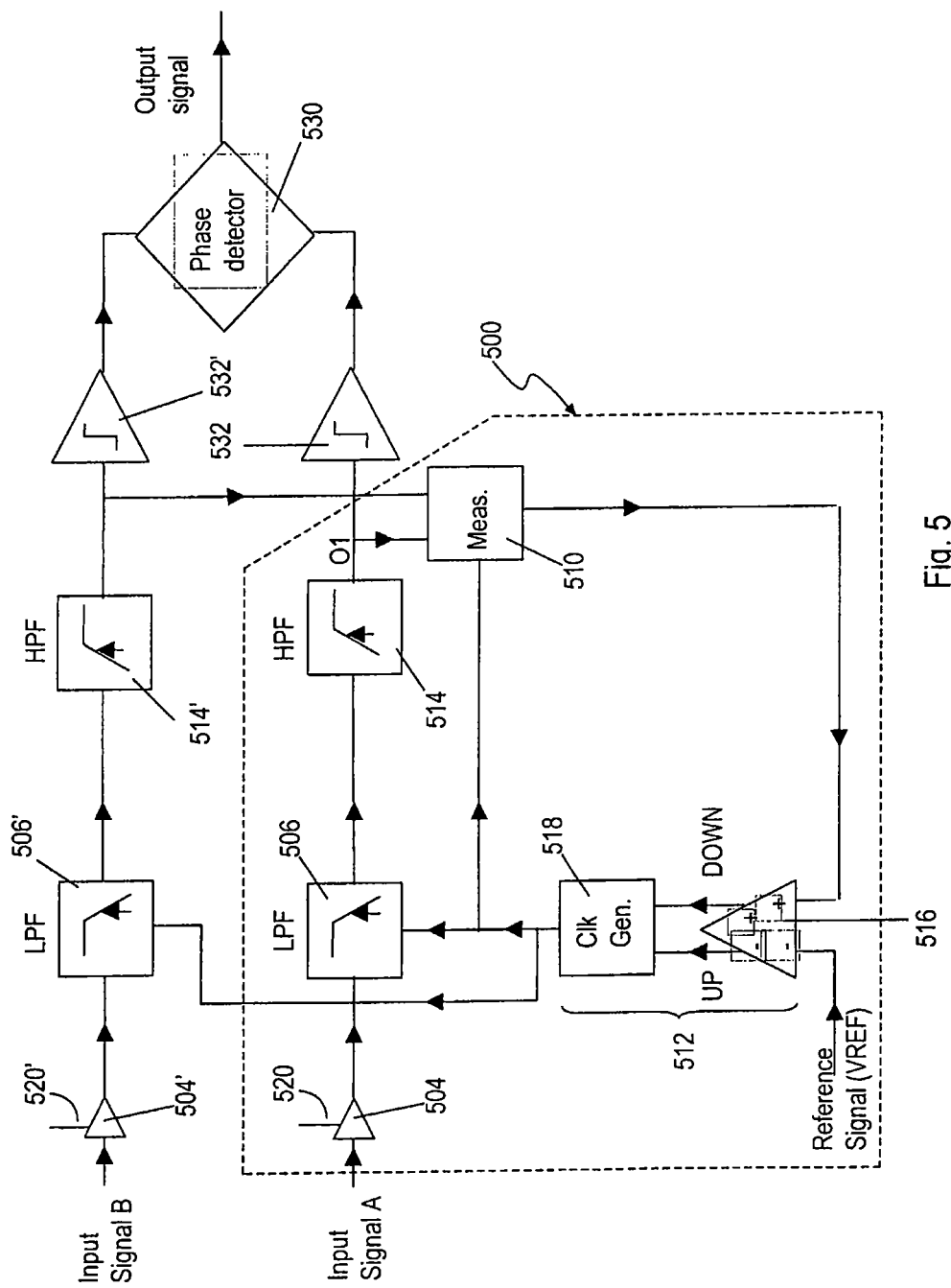
FIG. 5 is a block diagram of a second tracking filter apparatus embodying said one aspect of the present disclosure, and shown as part of a shock sensor interface in conjunction with phase detection apparatus.

Referring now to FIG. 5, there is shown a second embodiment of a tracking filter apparatus 500. The apparatus 500 is generally similar to the filter apparatus 300 and so like numerals have been used to indicate like parts and the same description applies as would be apparent to a skilled person.

The filter apparatus 500 may be incorporated into a shock sensor interface, for example of the type described above with reference to FIG. 2. As such, the input signal (Input signal A in FIG. 5) emanates from a shock sensor (not shown in FIG. 5), or other device, that rotates during use, the fundamental frequency of the electrical signal produced by the shock sensor, or other device, depending on the rotational speed of the wheel. The noise components of the input signal tend to be higher in frequency than the fundamental frequency and so the apparatus 500 includes an adjustable filter 506 configured to act as a low pass filter, for example a 2 pole low pass filter. The apparatus 500 also includes a variable gain amplifier 504 (other pre-processing circuitry may be provided but is not shown in FIG. 5 for reasons of clarity) for adjusting the level of the input signal. An output signal measuring circuit 510 is provided for measuring the amplitude of the output signal at point O1 and generating a corresponding output signal that is sent to an evaluation and control circuit 512. A high pass filter 514 may optionally be provided after the filter 506 but before point O1 in order to remove any dc offsets that may be present in the signal.

The output signal measuring circuit 510 preferably comprises a peak detector, and may also include a full wave rectification circuit for rectifying the signal at O1. The measuring circuit 510 detects and holds the peak amplitude value of the signal at O1 by means of the peak detector and any suitable voltage storage device, for example one or more capacitors. The measuring circuit 510 is configured to produce an output signal, conveniently a dc signal, which is representative of the measured peak value of the signal at O1.

The evaluation and control circuit 512 includes a comparator 516 arranged to receive and compare a reference signal VREF (typically in the form of a voltage signal) and the output signal of the measuring apparatus 510. The comparator 516 produces an output depending on the result of the comparison. In the illustrated example, the comparator 516 generates two output signals, namely an UP signal, which is asserted if the comparator 516 determines that the cut off frequency Fc should be increased, and a DOWN signal, which is asserted if the comparator 516 determines that the cut off frequency Fc should be decreased. The evaluation and control circuit 512 further includes a clock signal generator 518, which receives the outputs of the comparator 516 and is configured to generate a clock signal FCLK that is provided to the control input 507 to serve as the control input signal for the adjustable filter 506. In this example, the filter 506 is assumed to be of the type that is adjustable by means of changes in the frequency of a clock signal provided at the control input, for example a switched capacitor filter. The clock signal generator 518 is responsive to the UP or DOWN signal to increase or decrease the frequency of FCLK.

In preferred embodiments, the measuring apparatus 510, especially when it comprises a peak detector circuit, is arranged to operate with a variable time constant. Advantageously, the output signal from the clock signal generator 518 is supplied to the measuring apparatus such that the time constant of the apparatus 510 is varied in accordance with frequency of the detected signal. This has the effect of optimizing, and preferably minimizing, settling time and so shorten the time taken to track a signal. It also helps to reduce overshoot or undershoot of the filter 506, which affects signal output amplitude.

The clock signal generator 518 may be implemented by any suitable means as will be apparent to a skilled person. For example, the clock signal generator may comprise an analogue voltage controlled oscillator (VCO). Preferred clock generators are arranged to provide a smooth change of frequency for the filter 506, 506' and a substantially constant tracking rate of the detected signal.

It is preferred that a degree of tolerance is allowed on either side of the reference signal when making the comparison with the measured output signal, i.e. the measured signal is deemed not to match the reference signal only if the measured signal is less than the reference signal by more than a threshold amount, or more than the reference signal by more than a threshold amount. This may be achieved by using a window type comparator as comparator 516, wherein the comparator has a lower activation threshold that is below the reference signal by a threshold amount, and an upper activation threshold that is above the reference signal by a threshold amount. In this example, the UP signal is asserted when the measured signal is less than the lower activation threshold, and the DOWN signal is asserted when the measured signal is higher than the upper activation threshold (although the opposite would be true if the filter 506 were a high pass filter). This tolerance dampens the adjustment of the cut off frequency and reduces the effects that internal circuits may otherwise have on the operation of the apparatus 500.

The variable gain amplifier 504 has a gain input 520 by which its gain may be adjusted. The primary purpose of the amplifier 504 is to adjust the amplitude of the input signal to a level such that the expected amplitude value of the output signal that is measured by the measuring circuit 510, based on the known attenuation applied by the filter at the cut off frequency Fc (or other chosen point on the roll off slope of the filter's 506 response) and taking into account any other gain or attenuation that may be applied to the input signal before the point at which it is measured, is substantially the same as the reference signal VREF. As a result, when the fundamental frequency of the input signal substantially matches the cut off frequency Fc (or other chosen point on the roll off slope of the filter's 506 response) the measured output signal will have an amplitude that is substantially the same as VREF, in which case the value of Fc will not be adjusted. However, when the fundamental frequency of the input signal does not substantially match the cut off frequency Fc (or other chosen point on the roll off slope of the filter's 506 response) the measured output signal will have an amplitude that is higher or lower than the reference signal VREF and so the value of Fc will be adjusted, as described above. This arrangement has the effect of keeping the cut off frequency Fc (or other chosen point on the roll off slope of the filter's 506 response) substantially at the fundamental frequency of the input signal and so the apparatus 500 may be said to track the input signal.

It is noted that the location on the roll off slope of the filter characteristic that is chosen to correspond with the fundamental frequency of the input signal need not necessarily be the cut off frequency Fc. For example, if the filter 506, together with any associated components, add, say 12 dB (or any other level of gain) of frequency independent gain to the input signal, then the net gain applied to the input signal at the −12 dB (or other corresponding level of attenuation) point on the roll off slope is 0 dB. Hence, the −12 dB (or other attenuation level) point could be the chosen location in the roll off region. It is convenient to choose a point on the roll of slope of the frequency response that gives a net gain of substantially 0 dB since this allows the amplitude of the input signal to be adjusted to a level where it substantially matches the reference signal VREF.

In the example of FIG. 5, the wheel monitor with which the apparatus 500 is being used includes two shock sensors, each producing a respective output signal. In order to process both shock sensor signals, a respective variable gain amplifier 504', adjustable filter 506' and (if required) high pass filter 514' are provided for the second input signal, Input signal B, in the same manner as for Input signal A. However, the filter control circuit 510, 512 may be shared by both filters 506, 506' as is shown in FIG. 5. The measurement circuit 510 measures the amplitude of the output signal from both filter branches and the evaluation and control circuit 512 produces a common filter control signal for each filter 506. 506'. This arrangement has the effect of maintaining a phase relationship between the filters 506, 506'.

In the illustrated embodiment, a phase detector 530 is provided to determine the relative phase relationship between the filtered output signals from the respective shock sensors. In particular, the phase detector 530 is arranged to determine which of the filtered output signals leads the other since this allows a determination concerning the location of the wheel on its vehicle to be made (as is described in more detail in U.S. Pat. No. 7,367,227). Hence the output signal of the phase detector 530 provides an indication concerning wheel location. Prior to being provided to the phase detector 530, each channel is passed through a respective comparator 532, 532', for example of the type sometimes referred to as zero crossing detectors, each being configured to generate a square waveform corresponding to the respectively received filtered output signal. The phase detector 530 may be implemented by any suitable means as would be apparent to a skilled person. It will be understood that the disclosure is not limited to use with a phase detector.

Figure 6A:
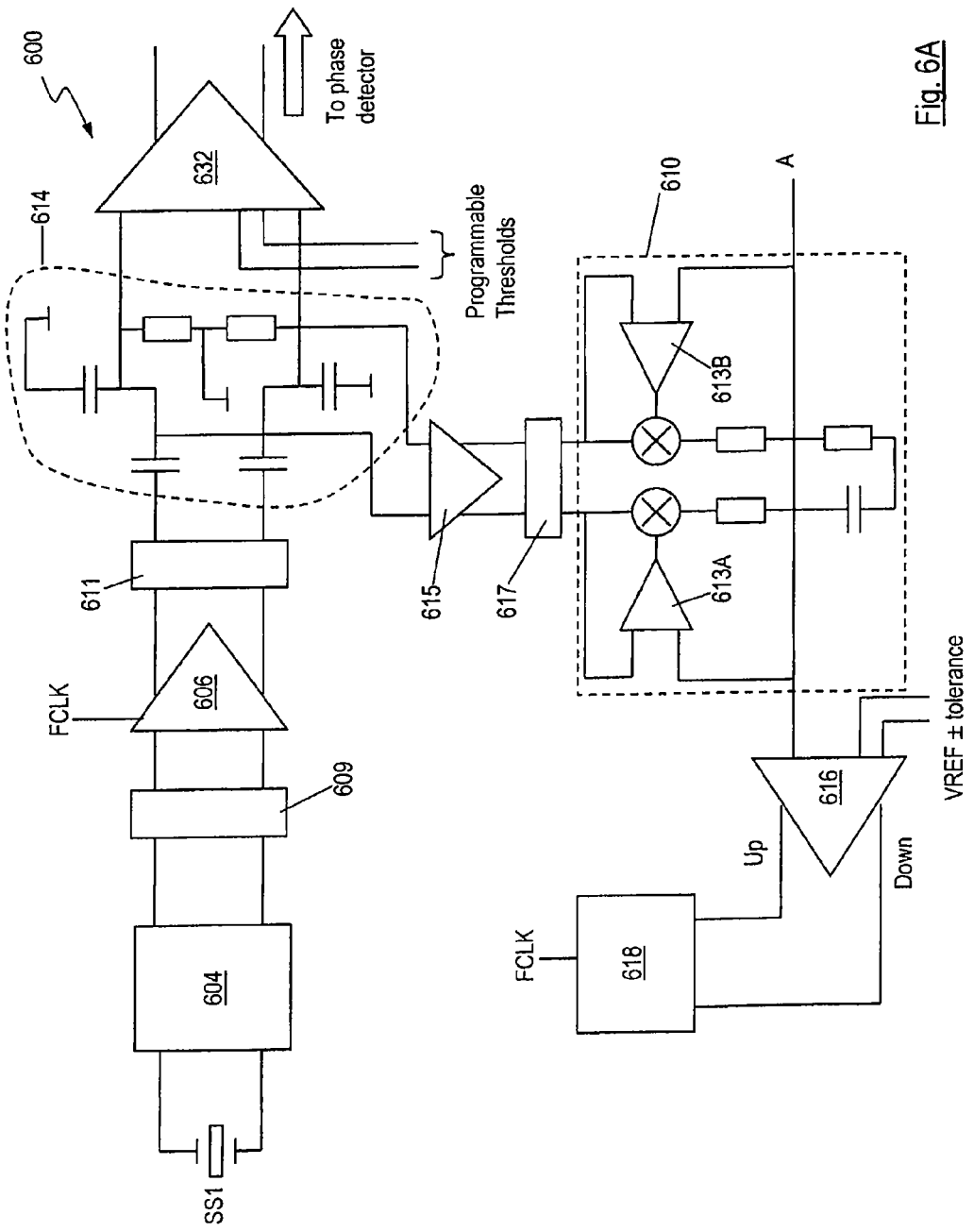
FIGS. 6A and 6B together are schematic diagram showing an exemplary implementation of the second tracking filter apparatus.
Figure 6B:
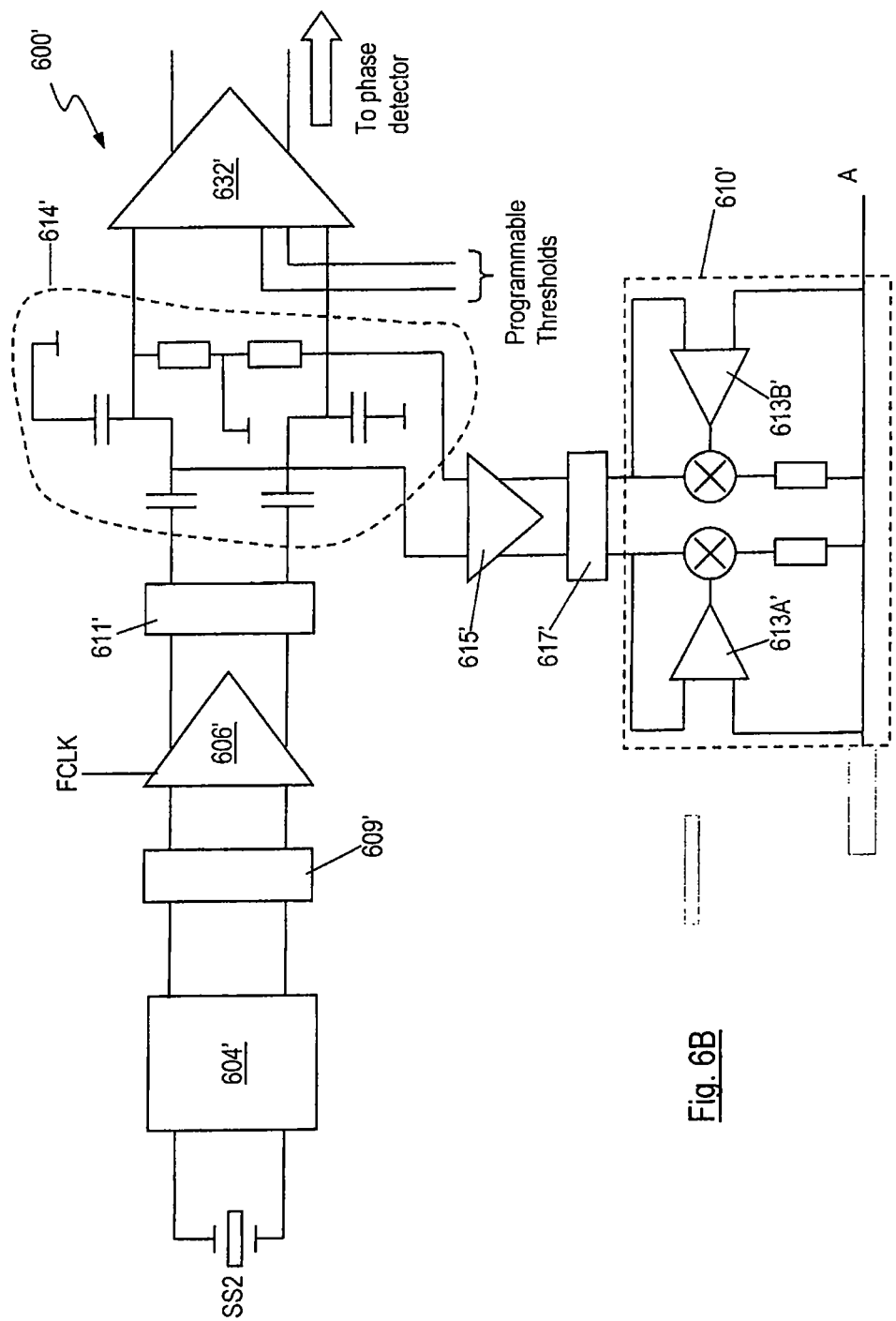

FIG. 6A shows, by way of example, a specific embodiment of a tracking filter apparatus 600. FIG. 6B shows a complementary tracking filter apparatus 600' that shares common filter control circuitry with the filter apparatus 600. The apparatus 600, 600' are together suitable for use in the circuit of FIG. 5 as examples of the apparatus 500, 500'. In FIGS. 6A and 6B, a respective shock sensor SS1, SS2 is also shown for providing respective input signals (although other sensors, especially motion sensors, accelerometers or accelerometric devices could alternatively be used), and the output of the respective apparatus 600, 600' is shown connected to a respective comparator 632, 632' as described above in relation to FIG. 5. The filter apparatus 600, 600' are generally similar to the filter apparatus 500, 500' and so like numerals are used to indicate like parts and similar descriptions apply as will be apparent to a skilled person.

The filters 606, 606' operate as differential circuits, accepting a differential input from the respective shock sensor SS1, SS2 and providing a respective differential output signal to the respective comparator 632, 632'. The pre-processing module 604, 604' includes a differential amplifier, preferably with variable gain, and may also include other pre-processing circuitry, for example filters and/or buffers, as may suit the application.

The adjustable filters 606, 606' may take any convenient form, for example a switched capacitor tracking filter. In the present example, the filters 606, 606' each take the form of a switched capacitor low pass filter with, preferably, a 2 pole Butterworth response. A 2 pole filter was chosen as it gives good attenuation and has a roll off slope that is not too steep to control the signal amplitude on its slope. In order to have reliable control of where the filter is, the fundamental signal should sit on the slope of the filter response, as described above.

A respective doubler 609, 611, 609', 611' may be provided at the input and the output of the filters 606, 606'. The doublers may be implemented as switched capacitor gain stages with a gain of 2. These also provide a filtering characteristic (typically a single pole frequency response) and so, in the illustrated example, the input doubler 609, 609' contributes to the filter response of the low pass switched capacitor filter 606, 606'. The output doubler also has a single pole frequency response but its pole is sufficiently far from the cut off frequency Fc of the filters 606, 606' that it does not appreciably contribute to the filter response.

The cut off frequency Fc, e.g. the −3 dB point of the filter response, is adjustable by the FCLK signal. Since the filter 606, 606' provides frequency independent gain (12 dB of gain in this example), it is convenient to control the filter 606, 606' response so as to position the fundamental component of the input signal substantially at a location in the roll off region of the response that provides a corresponding attenuation that substantially negates the effect of the frequency independent gain (i.e. the −12 dB part of the filter response slope in this example). As a result, the filter 606, 606' has no net affect on the gain of the system.

Positioning the fundamental component of the signal on the slope of the frequency response, and in particular further down the slope than Fc, allows for a wide tolerance for signal noise and variation.

The high pass filters 614, 614' are also differential circuits. The purpose of the high pass filters 614, 614' is to remove any dc offsets and to help during acceleration and deceleration to take out the offsets occurring on the shock sensors SS1, SS2. The high pass filters 614, 614' feed both the respective output comparators 632, 632' and respective measurement circuitry 610, 610'. It is advantageous for both of these circuits not to have dc offsets present on their inputs.

The high pass filters 614, 614' preferably have as low as possible cut off frequency to avoid attenuation of the signal at low frequencies. The high pass filters 614, 614' are each split into 2 parts, one for the positive and one for the negative signals of the differential signal. It is desirable to have good matching between the two halves of the filter. Since there is preferably a very low cut off frequency, it is possible for leakage to occur and introduce an offset. However this will, providing the two parts of the filter 614, 614' are matched, not result in a differential offset, just a common mode offset.

The output comparators 632, 632' are fully differential and provide a positive output and a negative output, providing a comparison of the voltage seen across its inputs, which generates a current that is compared against an internally generated offset current. This equates to the input voltage being compared to a deliberately generated voltage offset, which occurs in the positive and negative senses. If the input voltage exceeds the internal offset voltage it will trigger positively or negatively respectively. If it does not exceed the trigger threshold both positive and negative outputs remain low. This provides a square wave logic level signal which can then be further processed by the phase detector (not shown in FIGS. 6A and 6B).

The measurement circuitry 610, 610' comprises a respective peak detector. The peak detector circuitry has the effect of full wave rectification on signals received by it. The peak detector comprises two comparators 613A, 613B. One comparator 613A tracks the peak signal on the positive output of the received differential signal and the other comparator 613B tracks the negative output of the received differential signal when it goes to positive. There is a single capacitor for signal hold and a switched capacitor resistor for bias to a reference signal (1.2V in this example).

The peak detector circuits are not differential. They are single ended and use the direct output voltage of the positive or negative parts of the received differential signal and so are affected by the common mode offset. A buffer circuit 615 may be provided at the input of the peak detector. This primarily provides a high input impedance to the peak detector. A doubler circuit 617 may be provided at the output of the buffer 615, which can be set to double or not. This arrangement provides a direct correction of any common mode offset that may come from the high pass filter 614.

It will be seen from FIG. 6B that part of the measurement circuitry is repeated 613A', 613B', the buffer 615' and the doubler 617'. However, the output of the peak detector for this branch of the circuit is combined with the output of the peak detector 611, as indicated by connection A appearing in FIGS. 6A and 6B to provide a combined peak detector output from both branches of the circuit.

The output of the peak detector 610, 610' is fed into a comparator 616. As described in relation to FIG. 5, the comparator has two outputs, UP and DOWN, which are used to move the roll off point of the switched capacitor tracking filters 606, 606' via a clock generator 618 that generates the FCLK signal.

By way of example, the comparator 616 may have a lower threshold of 115 mV and an upper threshold of 185 mV. The comparator 616 compares the output from the peak detector to a 150 mV reference signal and the resulting output generates either an up signal or a down signal. This allows a tolerance of +/−35 mV on either side of the reference signal value.

Tracking filter apparatus embodying the disclosure may alternatively be used to process signals emanating from devices, especially sensors, other than shock sensors. For example, the tracking apparatus 300, 500, 600 may receive, as an input signal, the output signal produced by an accelerometer, MEMs sensor or other motion sensor. Such sensors may also be used in pairs as described above in relation to the shock sensors and so two channel circuits such as those shown in FIGS. 5 and 6 may also be used for processing the output signals of other sensors, especially motion sensors.

By way of example, when using a MEMs sensor as a motion detector in a wheel monitoring device, the MEMs sensor suffers from a similar problem as a shock sensor in that, when trying to detect a G-force as the wheel rotates, noise and shocks from the road are also picked up making it difficult to separate the G-signal from the road noise. The G-signal can be extracted from the capacitive MEMs sensor by injecting a charge onto the capacitor plate at a certain frequency and then using a capacitive integrator circuit to accumulate each sample of charge. A change of capacitance changes the accumulated voltage coming out of the integrator and thereby a G-signal can be detected by amplifying this signal. The amplified signal can then be passed into a tracking filter apparatus embodying the disclosure to clean up the signal in the same way as it would from an amplified shock sensor.

A MEMs sensor may have 2 or even 3 axes, but for this application typically only 2 axes are used. One problem that can arise when using a MEMs sensor is that the signal from the X-axis may be of significantly different amplitude to that from the Y-axis, in which case this difference has to be accommodated for in the amplifier gains of the different channels of the tracking filter apparatus.

Advantageously, the filter clock frequency signal FCLK may be used to calibrate the tracking filter apparatus 300, 500, 600 so that the gain of the amplifier 504 (or equivalent amplification in the signal pre-processing modules (304, 604) aligns the filter 306, 506, 606 in the desired operating region (as described above). In preferred embodiments, there is a fixed relationship between the filter clock frequency and the fundamental frequency of the input signal. Typically, the frequency of the filter clock frequency is a multiple of (e.g. ×100) the fundamental frequency.

When the gain of the amplifier 304, 504, 604 is at the desired level, the amplitude of the filtered signal (e.g. at point O1 in FIG. 5) substantially matches the reference value and the filter clock frequency is then a known multiple the fundamental signal frequency. Hence, when the apparatus 300, 500, 600 is calibrated correctly, the fundamental frequency can be determined from the filter clock frequency. It is therefore possible to deduce the wheel frequency of the vehicle from the filter clock frequency (and therefore the speed of the vehicle). This information can be used to check that the tracking filter is working correctly. For example, the wheel speed that is deduced from the filter clock frequency can be compared against another measure of the wheel speed (which may be provided by any convenient conventional means) and, if the two measures of wheel speed substantially match, then it may be assumed that the tracking filter apparatus is working correctly.

Typically, data representing the filter clock frequency is transmitted to the control unit 112 or elsewhere on the vehicle in order for the comparison to be performed. In cases where the clock signal generator 518 comprises a counter, a convenient way to obtain the required data for the filter clock frequency is to use the value of the counter that generates the filter clock frequency.

Figure 7:
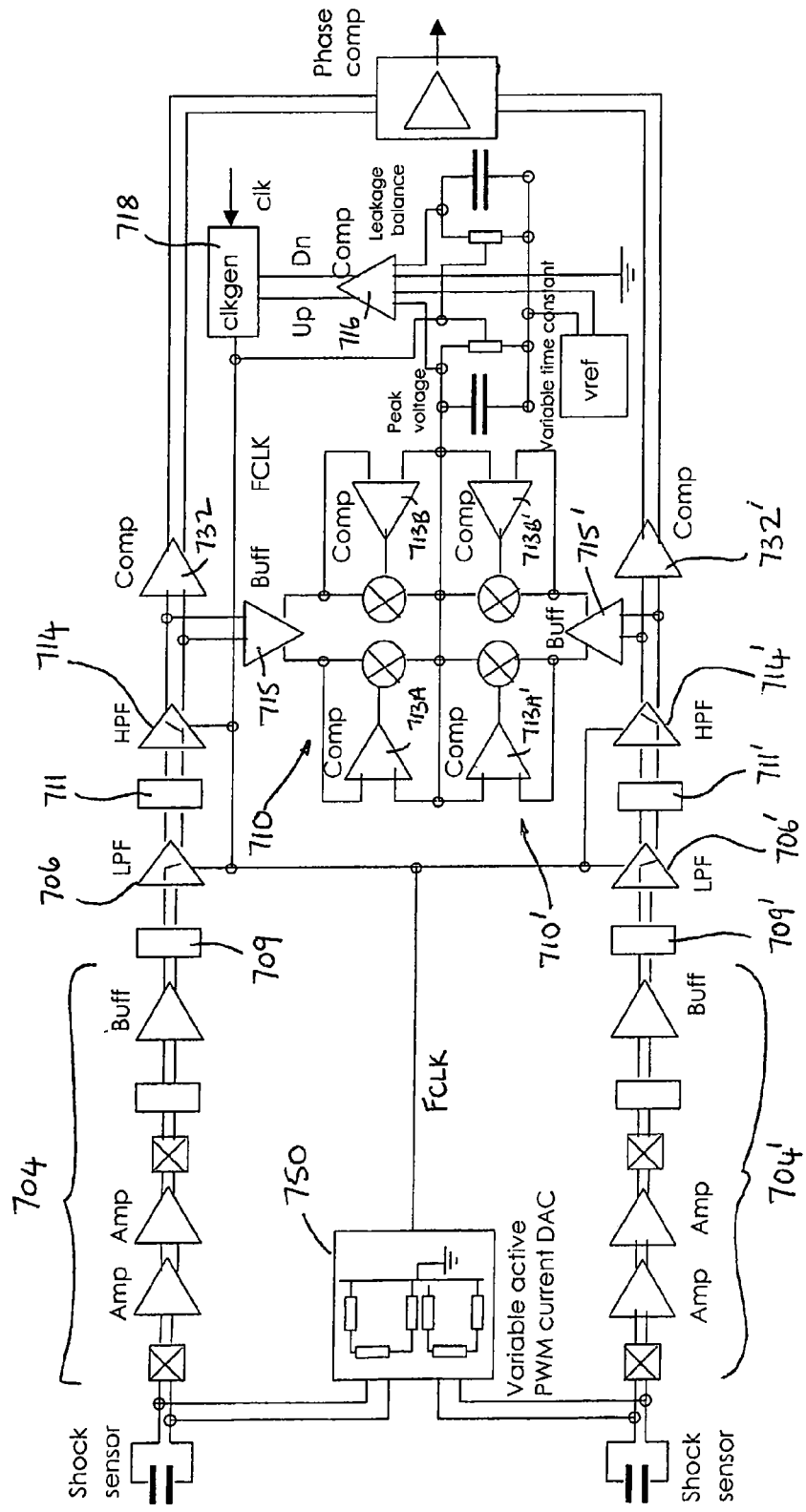

FIG. 7 shows an alternative embodiment of respective tracking filter apparatus for two shock sensors that share common filter control circuitry. The respective tracking filter apparatus are together suitable for use in the circuit of FIG. 5 as examples of the apparatus 500, 500'. In FIG. 7, a respective shock sensor is also shown for providing respective input signals (although other sensors, especially motion sensors, accelerometers or accelerometric devices could alternatively be used), and the output of the respective apparatus is shown connected to a respective comparator 732, 732' as described above in relation to FIG. 5. The filter apparatus are generally similar to the filter apparatus 500, 500', and more particularly to the apparatus 600, 600' and so like numerals are used to indicate like parts and similar descriptions apply as will be apparent to a skilled person.

The tracking filter apparatus of FIG. 7 include a respective pre-processing module 704, 704', including for example differential amplifiers, preferably with variable gain, and other pre-processing circuitry, for example filters and/or buffers, as may suit the application. The adjustable filters 706, 706' may take any convenient form, for example a switched capacitor tracking filter. In the present example, the filters 706, 706' each take the form of a low pass filter. A respective doubler 709, 711, 709', 711' may be provided at the input and the output of the filters 706, 706'.

The tracking filter apparatus of FIG. 7 also include respective high pass filters 714, 714' and respective measurement circuitry 710, 710'. The measurement circuitry 710, 710' comprises a respective peak detector, each comprising two comparators 713A, 713B and 713A', 713B'. A respective buffer circuit 715, 715' may be provided at the input of the peak detector. The outputs of the peak detectors 710, 710' are fed into a comparator 716. As described in relation to FIG. 5, the comparator has two outputs, UP and DOWN, which are used to move the roll off point of the switched capacitor tracking filters 706, 706' via a clock generator 718 that generates the FCLK signal.

In the embodiment of FIG. 7, the high pass filters 714, 714' are adjustable filters and may take any convenient form, for example a switched capacitor tracking filters. FCLK is supplied to the high pass filters 714, 714' in order to adjust their filtering characteristics, in particular their cut off point, in a manner similar to that described above in relation to filters 506, 606. Together, the respective low pass filters 706, 706' and the respective high pass filters 714, 714' provide a respective adjustable band pass filter, having a pass band that is adjustable in response to changes in FCLK, i.e. a tracking band pass filter.

The tracking filter apparatus of FIG. 7 also includes a variable active impedance module 750. The module 750 is connected to the respective input of the, or each, tracking filter apparatus between the shock sensor (or other input device) and the adjustable filter 706, 706'. The module 750 provides a variable impedance, e.g. variable resistance, in the input signal path. The impedance, or resistance, presented to the respective input signal is adjustable by a control signal received by the module 750. Conveniently, the control signal is provided by FCLK. Hence, the impedance, or resistance, tracks the main or fundamental component of the input signal since it is controlled by FCLK. This is advantageous since the tracking input impedance helps to create a substantially constant amplitude input signal from the shock sensors (or other input devices). This mitigates a problem that can sometimes arise at low frequencies as a result of the load impedance across the shock sensor causing an attenuation of the signal amplitude produced by the shock sensor. The filter clock signal FCLK is fed into the active input impedance 750 to provide a tracking input impedance, maintaining a substantially constant input signal.

The variable impedance module 750 may take any suitable form. For example, it may comprise a network of transistors, typically MOSFETs, arranged to act as resistors. The module 750 receives FCLK as a control signal for controlling the amount of bias current supplied to the transistors. This may be achieved by any convenient means, e.g. a PWM (pulse width modulation) current DAC (digital-to-analogue converter). In the preferred embodiment, by means of PWM, FCLK controls the bias current into the transistors and so controls the impedance, and in the preferred embodiment the resistance, presented by the module 750. The preferred module 750 comprises a PWM current DAC. The actual active resistor may comprise a current mirror, however because the bias current is so low and the voltage across the device is small (e.g. 0-790uV), the MOSFET is in the Sub threshold region of operation and in this mode it behaves as a resistor. Hence, in the preferred embodiment, the module 750 may be described as an active resistor wherein a PWM current DAC is used to bias a Sub Threshold NMOS programmed by a clock signal (FCLK) whose frequency varies in sympathy with the fundamental frequency of the input signal that is being tracked. The origin of the bias current may come from an internal oscillator which automatically gets trimmed when the oscillator is trimmed to give its correct frequency.

In alternative embodiments a fully differential peak detector may be used in place of the non-differential peak detectors described above. This removes the need to provide a leakage balance circuit.

The disclosure is not limited to the embodiments described herein which may be modified or varied without departing from the scope of the disclosure.

The invention claimed is:

1. A wheel monitoring system, comprising:
   a wheel monitoring device that is mountable on a wheel and configured to generate a first signal that is indicative of a characteristic of said wheel, said first signal having a main frequency that varies corresponding to a variation of a rotational speed of said wheel; and
   a tracking filter apparatus, comprising:
   an input configured to receive said first signal from said wheel monitoring device;
   an adjustable filter having an adjustable cut off frequency and configured to filter said first signal to produce a filtered first signal; and
   a filter controller being co-operable with said adjustable filter and being configured to:
   measure a characteristic of said filtered first signal; and
   compare said characteristic of said filtered first signal against a reference value;
   adjust said adjustable cut off frequency corresponding to a variation of said main frequency when said characteristic of said filtered first signal differs from said reference value by an amount that exceeds a threshold value,
   wherein said filtered first signal has a main signal component at said main frequency, said main signal component having an amplitude,
   wherein said characteristic of said filtered first signal comprises a peak said amplitude of said main signal component,
   wherein said filter controller comprises a peak detector configured to:
   detect the peak amplitude of said filtered first signal, and
   generate a direct current signal comprising an amplitude that is indicative of said detected amplitude of said filtered first signal.

2. The wheel monitoring system of claim 1, wherein said threshold value is zero.

3. The wheel monitoring system of claim 1, wherein said adjustable filter has a frequency response that comprises a roll off region to which said adjustable filter applies an attenuation that varies with frequency, and wherein said adjustable filter controller is configured to adjust the adjustable cut off frequency of said adjustable filter such that said main frequency lies within said roll off region.

4. The wheel monitoring system of claim 3, wherein said tracking filter apparatus is further configured to apply a frequency independent gain to said filtered first signal, and
   wherein said filter controller is configured to adjust said adjustable cut off frequency of said adjustable filter such that said main frequency lies at a location in said roll off region where said attenuation applied by said adjustable filter at least partially negates an effect of said frequency independent gain on said filtered first signal.

5. The wheel monitoring system of claim 4, wherein said attenuation applied by said adjustable filter at said location in said roll off region is higher than the attenuation applied by said adjustable filter at said adjustable cut off frequency.

6. The wheel monitoring system of claim 4, wherein said attenuation applied by said adjustable filter at said location in said roll off region negates substantially the entire effect of said frequency independent gain on said filtered first signal.

7. The wheel monitoring system of claim 4, wherein said frequency independent gain is applied at least partially by said adjustable filter.

8. The wheel monitoring system of claim 3, wherein said first signal and said filtered first signal each comprise a main signal component at said main frequency, said respective main signal components having a respective amplitude, and
   wherein the tracking filter apparatus further comprises an amplifier between said input and said adjustable filter, and the amplifier is configured to adjust the amplitude of said first signal to a level that causes the amplitude of said filtered first signal to substantially match said reference value when said main frequency lies at a selected location on said roll off region.

9. The wheel monitoring system of claim 1, wherein said adjustable filter comprises a low pass filter, and
   wherein said filter controller is co-operable with said adjustable filter to increase said adjustable cut off frequency when said characteristic of said filtered first signal is less than said reference value by an amount that exceeds a first threshold value, and to decrease said adjustable cut off frequency when said characteristic of said filtered first signal is more than said reference value by an amount that exceeds a second threshold value.

10. The wheel monitoring system of claim 1, wherein said adjustable filter comprises a high pass filter, and
    wherein said filter controller is co-operable with said adjustable filter to increase said adjustable cut off frequency when said characteristic of said filtered first signal is more than said reference value by an amount that exceeds a first threshold value, and to decrease said adjustable cut off frequency when said characteristic of said filtered first signal is less than said reference value by an amount that exceeds a second threshold value.

11. The wheel monitoring system of claim 1, wherein said filter controller comprises a comparator configured to compare said characteristic of said filtered first signal with said reference value and to produce at least one output signal, said at least one output signal determining how said adjustable cut off frequency is to be adjusted.

12. The wheel monitoring system of claim 1, wherein said adjustable filter has a control input configured to receive a clock signal,
    wherein the clock signal controls the adjustable cut off frequency of the adjustable filter, and
    wherein said filter controller comprises a clock signal generator configured to generate said clock signal, the clock signal having a frequency that is adjusted by said clock signal generator when said characteristic of said filtered first signal differs from said reference value by an amount that exceeds said threshold value.

13. The wheel monitoring system of claim 1, wherein said wheel monitoring device comprises a tire pressure monitoring device.

14. The wheel monitoring system of claim 1, wherein said wheel monitoring device comprises a first motion sensor, said first signal being generated by said first motion sensor.

15. The wheel monitoring system of claim 14, wherein said wheel monitoring device further comprises:
    a second motion sensor, generating a second signal that is indicative of said characteristic of said wheel, said second signal having a second main frequency that is corresponding to said rotational speed of said wheel, said wheel monitoring system further comprises:
a second tracking filter apparatus, comprising:
an second input configured to receive said second signal; and
an second adjustable filter having an second adjustable cut off frequency and configured to filter said second signal to produce a filtered second signal, and
wherein said filter controller is co-operable with said adjustable filter and configured to:
measure a characteristic of said filtered second signal;
compare said characteristic of said filtered second signal against said reference value; and
adjust said second adjustable cut off frequency corresponding to a variation of said second main frequency when characteristic of said filtered second signal differs from said reference value by an amount that exceeds a second threshold value.

16. The wheel monitoring system of claim 15, wherein said first and second motion sensors comprise at least one of the following sensors: a shock sensor; an accelerometer; and a microelectromechanical systems (MEMS) sensor.

17. The wheel monitoring system of claim 1, further comprising an adjustable impedance module connected between said input and said adjustable filter, said adjustable impedance module being controllable by said filter controller to adjust the impedance of said adjustable impedance module when said characteristic of said filtered first signal differs from said reference value by an amount that exceeds a threshold value.

18. A wheel monitoring system, comprising:
a wheel monitoring device that is mountable on a wheel and configured to generate a first signal that is indicative of a characteristic of said wheel, said first signal having a first main frequency that varies corresponding to a variation of a rotational speed of said wheel; and
a first tracking filter apparatus, comprising:
a first input configured to receive said first signal from said wheel monitoring device;
a first adjustable filter having a first adjustable cut off frequency and configured to filter said first signal to produce a filtered first signal;
a filter controller being co-operable with said first adjustable filter and being configured to:
measure a characteristic of said filtered first signal;
compare said characteristic of said filtered first signal against a reference value; and
adjust said first adjustable cut off frequency when said characteristic of said filtered first signal differs from said reference value by an amount that exceeds a threshold value;
wherein said wheel monitoring device comprises
a first motion sensor, said first signal being generated by said first motion sensor;
a second motion sensor, generating a second signal that is indicative of said characteristic of said wheel, said second signal having a second main frequency that is corresponding to said rotational speed of said wheel,
said wheel monitoring system further comprising:
a second tracking filter apparatus, comprising:
an second input configured to receive said second signal; and
an second adjustable filter having an second adjustable cut off frequency and configured to filter said second signal to produce a filtered second signal, and
wherein said second filter controller being co-operable with said adjustable filter and being configured to:
measure a characteristic of said filtered second signal; and
compare said characteristic of said filtered second signal against said reference value;
adjust said second adjustable cut off frequency when said characteristic said filtered second signal differs from said reference value by an amount that exceeds a threshold value, and
said wheel monitoring system further comprising:
a phase detector, each of said first and second filtered signals being provided to the phase detector, said phase detector being configured to determine a phase relationship between said first and second filtered signals.

19. The wheel monitoring system of claim 18, wherein said wheel is mounted on a vehicle and said system is configured to make a determination concerning a location of said wheel on said vehicle depending on said phase relationship.

20. A wheel monitoring system, comprising:
a wheel monitoring device that is mountable on a wheel and configured to generate a first signal that is indicative of a characteristic of said wheel, said first signal having a main frequency that varies corresponding to a variation of a rotational speed of said wheel; and
a tracking filter apparatus, comprising:
an input configured to receive said first signal from said wheel monitoring device;
an adjustable filter having an adjustable cut off frequency and configured to filter said first signal to produce a filtered first signal; and
a filter controller being co-operable with said adjustable filter and being configured to:
measure a characteristic of said filtered first signal; and
compare said characteristic of said filtered first signal against a reference value;
adjust said adjustable cut off frequency corresponding to a variation of said main frequency when said characteristic of said filtered first signal differs from said reference value by an amount that exceeds a threshold value;
an adjustable impedance module connected between said input and said adjustable filter, said adjustable impedance module being controllable by said filter controller to adjust impedance of said adjustable impedance module when said characteristic of said filtered first signal differs from said reference value by an amount that exceeds a threshold value,
wherein said adjustable impedance module comprises a network of transistors,
wherein said filter controller is configured to provide a pulse width modulated clock signal to a bias control input of said network to control a bias current of said transistors.

21. A method of tracking a main frequency component of a first signal in a wheel monitoring system, said main frequency varying corresponding to a variation of a rotational speed of a wheel, wherein said wheel monitoring system comprises:
an adjustable filter having an adjustable cut off frequency and a control input configured to receive a clock signal, wherein the clock signal controls said adjustable cut off frequency of said adjustable filter, and
a filter controller co-operable with said adjustable filter,
the method comprising:
filtering said first signal, by said wheel monitoring system, to produce a filtered first signal;
measuring, by said wheel monitoring system, at least one characteristic of said filtered first signal;
comparing, by said wheel monitoring system, said characteristic of said filtered first signal against a reference value; and adjusting, by said wheel monitoring system, said adjustable cut off frequency when said characteristic of said filtered first signal differs from said reference value by an amount that exceeds a threshold value, deriving, by said wheel monitoring system, from said clock signal a measure of said rotational speed of said wheel;

comparing, by said wheel monitoring system, said measure of said wheel speed against an alternative measure of said wheel speed; and determining, by said wheel monitoring system, that said adjustable filter is operating correctly if said measure and said alternative measure of said wheel speed substantially match.

\* \* \* \* \*